United States Patent
Jeong

(10) Patent No.: US 10,111,341 B2
(45) Date of Patent: Oct. 23, 2018

(54) METHOD OF MANUFACTURING BRAKE PEDAL COIL PRINTED CIRCUIT BOARD FOR VEHICLE

(71) Applicant: DODO TECH CO., LTD., Gyeonggi-do (KR)

(72) Inventor: Chanboung Jeong, Incheon (KR)

(73) Assignee: DODO TECH CO., LTD., Gyeonggi-do (KR)

( * ) Notice: Subject to any disclaimer, the term of this patent is extended or adjusted under 35 U.S.C. 154(b) by 154 days.

(21) Appl. No.: 15/202,549

(22) Filed: Jul. 5, 2016

(65) Prior Publication Data

US 2017/0008450 A1  Jan. 12, 2017

(30) Foreign Application Priority Data

Jul. 8, 2015  (KR) .................. 10-2015-0097257

(51) Int. Cl.
*H01K 3/22* (2006.01)
*H05K 3/18* (2006.01)
(Continued)

(52) U.S. Cl.
CPC .............. *H05K 3/188* (2013.01); *B60T 7/042* (2013.01); *B60T 7/06* (2013.01); *G05G 1/30* (2013.01); *H05K 3/067* (2013.01); *H05K 3/422* (2013.01); *H05K 3/429* (2013.01); *H05K 2203/072* (2013.01); *H05K 2203/0723* (2013.01)

(58) Field of Classification Search
CPC ........ H05K 3/429; H05K 3/422; H05K 3/067; H05K 3/188; B60T 7/042; B60T 7/06; G05G 1/30
See application file for complete search history.

(56) References Cited

U.S. PATENT DOCUMENTS 5,698,470 A * 12/1997 Yamaguchi .......... H05K 3/4655
156/273.9
8,829,355 B2 * 9/2014 Kariya .................. H01L 21/486
174/255

(Continued)

FOREIGN PATENT DOCUMENTS

| JP | H11135942 A | 5/1999 |
| JP | 2004328006 A | 11/2004 |
| KR | 100774529 B1 | 11/2007 |

*Primary Examiner* — Paul D Kim
(74) *Attorney, Agent, or Firm* — Moser Taboada

(57) ABSTRACT

A method of manufacturing a brake pedal coil printed circuit board is provided. The method comprises preparing a first epoxy layer having first copper foil laminated on both surfaces thereof; laminating each of second epoxy layers on the first copper foil, and laminating second copper foil on each of the second epoxy layers; forming a through hole, performing electroless copper plating on an inside surface of the through hole and the second copper foil, and forming an electrolytic copper-plated layer on each of the electroless copper-plated layer; forming circuits having a predetermined pattern on the electrolytic copper-plated layer and the electroless copper-plated layer and forming a gap between the circuits; applying a PSR ink onto the electrolytic copper-plated layer; applying a marking ink onto the PSR ink; forming a Ni-plated layer around the through hole and the hole land; and forming an Au-plated layer on the Ni-plated layer.

12 Claims, 7 Drawing Sheets

(51) Int. Cl.
*H05K 3/42* (2006.01)
*H05K 3/06* (2006.01)
*B60T 7/04* (2006.01)
*B60T 7/06* (2006.01)
*G05G 1/30* (2008.04)

(56) References Cited

U.S. PATENT DOCUMENTS

| | | | |
|---|---|---|---|
| 9,313,901 B2 * | 4/2016 | Kajihara | H05K 3/427 |
| 9,513,144 B2 * | 12/2016 | Kum | G01D 5/22 |
| 2005/0241954 A1 * | 11/2005 | Iwanami | C25D 3/38 |
| | | | 205/182 |

* cited by examiner

METHOD OF MANUFACTURING BRAKE PEDAL COIL PRINTED CIRCUIT BOARD FOR VEHICLE

CROSS-REFERENCE TO RELATED APPLICATIONS

This application claims priority to and the benefit of Korean Patent Application No. 10-2015-0097257, filed on Jul. 8, 2015, the disclosure of which is incorporated herein by reference in its entirety.

BACKGROUND

Field of the Invention

The present invention relates to a method of manufacturing a brake pedal coil printed circuit board for vehicles, and more particularly, to a method of manufacturing a brake pedal coil printed circuit board for vehicles which, when a driver in front suddenly stops a car during driving or suddenly hits the brake for a sudden slow down, is capable of allowing drivers of cars behind to quickly see and determine the critical situation.

Description of the Related Art

In general, brake lights for vehicles include rear brake lights which are turned on when a driver steps on the foot brake and hand brake lights arranged on a car dashboard which are turned on when a driver engages the hand brake, etc. In particular, the rear brake lights for a vehicle are turned on when a driver steps on the foot brake to slow down a car and thus serve to alert drivers of the cars behind.

However, since conventional rear brake lights are turned on only when a driver steps on a foot brake pedal (physical energy is applied to the foot brake pedal), there is a risk of collision accidents when a driver suddenly steps on the foot brake and drivers of the cars behind do not keep a sufficient distance between cars. That is, the conventional rear brake lights have drawbacks in that, when a driver steps on a foot brake pedal, time is required to turn on rear brake lights due to a brake spacing (a gap between a brake lining and a disk over which the brake lining pushed by a fluid pressure in a master cylinder travels to reach the disk when a driver steps on the foot brake pedal) and, when a driver keeps foot on the foot brake pedal, time is required to transmit signals through wires in order to turn on the rear brake lights.

SUMMARY

Therefore, the present invention is designed to solve the problems of the prior art, and it is an object of the present invention to provide a method of manufacturing a brake pedal coil printed circuit board for vehicles which is capable of allowing a wireless sensor to quickly sense whether physical energy from a driver is applied to a foot brake pedal to turn on rear brake lights.

According to an aspect of the present invention, there is provided a method of manufacturing a brake pedal coil printed circuit board for vehicles, which includes preparing a first epoxy layer having first copper foil laminated on both surfaces thereof (S100), laminating each of second epoxy layers on the first copper foil, and laminating second copper foil on each of the second epoxy layers (S200), forming a through hole A passing through upper and lower surfaces, performing electroless copper plating on an inside surface of the through hole A and the second copper foil, and forming an electrolytic copper-plated layer on each of the electroless copper-plated layer of the through hole A and the electroless copper-plated layer formed on the second copper foil (S300), forming circuits having a predetermined pattern on the electrolytic copper-plated layer and the electroless copper-plated layer and forming a gap between the circuits to have the same size as the circuits (S400), applying a PSR ink onto the electrolytic copper-plated layer excluding the through hole A and a hole land (S500), applying a marking ink onto the PSR ink (S600), forming a nickel (Ni)-plated layer around the through hole A and the hole land (S700), and forming an Au-plated layer on the Ni-plated layer (S800), Also, in the method of manufacturing a brake pedal coil printed circuit board for vehicles according to the present invention, in S100, the first epoxy layer may be a 300 μm-thick prepreg which has a coefficient of thermal expansion (CTE) of 45 ppm/° C., a glass transition temperature (TG) of 150° C. and a thermal decomposition temperature (TD) of 370° C., and includes 1-ounce (oz) first copper foil formed on both surfaces thereof.

In addition, the method of manufacturing a brake pedal coil printed circuit board for vehicles according to the present invention may further include a first imaging process between S100 and S200. Here, the first imaging process may include a dry film lamination process (A1) of laminating a photoresist PR on the first copper foil and then laminating a dry film, which has a circuit pattern of a predetermined shape formed therein, on the photoresist using a roller having a roller temperature of 95° C. to 120° C., a roller pressure of 0.2 to 0.5 MPa, and a roller speed of 0.75 to 0.85 m/min, an exposure process (B1) of irradiating the dry film of the circuit pattern of the predetermined shape with light which is radiated with a light intensity of 20 to 50 mJ/cm2 by an 8 kW exposure system so that the circuit pattern of the predetermined shape is formed in the photoresist, a developing process (C1) of spraying 0.5% to 1.0% (vol) of a sodium carbonate developing solution having a temperature of 24° C. to 30° C. at a spray pressure of 0.10 MPa to 0.15 MPa to remove the photoresist from a region excluding the circuit pattern of the predetermined shape and the hole land, an etching process (D1) of spraying 150 g/L to 220 g/L of a copper metal etching solution at a temperature of 45° C. to 53° C. and a specific gravity (at 20° C.) of 1.19±0.03 at a pressure of 1.5 kgf/cm² 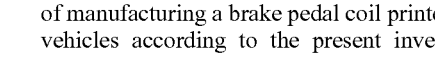 to remove the first copper foil from the region excluding the circuit pattern of the predetermined shape and the hole land, and a stripping process (E1) of spraying 2% to 4.2% (vol) of a sodium hydroxide stripping solution at a temperature of 48° C. to 60° C. at a spray pressure of 0.10 MPa to 0.14 MPa to remove the photoresist remaining on the circuit pattern of the predetermined shape, wherein, during the dry film lamination process (A1), a dry film having a thickness of 20 μm is used as the dry film to form a predetermined inner layer circuit.

Additionally, after the first imaging process, the method of manufacturing a brake pedal coil printed circuit board for vehicles according to the present invention may further includes an oxide process of oxidizing a copper surface of the predetermined inner layer circuit. Here, the oxide process may be performed as a brown oxide process performed according to the structural formula for an oxide reaction: $2Cu + ClO_2 \rightarrow Cu_2O$ (cupric oxide) + ClO.

Also, in the method of manufacturing a brake pedal coil printed circuit board for vehicles according to the present invention, in S300, computerized numeric control (CNC) M/C drilling may be performed to form the through hole, and a de-smear process of removing remnants or attachments of the second epoxy layers with KMnO4 may be performed. In this case, the remnants or attachments may be produced by heat of friction caused while drilling interfaces between the first copper foil and the second epoxy layers.

In addition, in the method of manufacturing a brake pedal coil printed circuit board for vehicles according to the present invention, in S300, the electroless copper-plated layer is formed to have a thickness of 1.3 μm to 1.7 μm by performing the electroless copper plating at a temperature of 40° C. (±2° C.) for 28 minutes in a plating solution which includes 82 g/L of copper sulfate, 155 g/L of ethylenediamine tetraacetic acid (EDTA), 32 mL/L of formaldehyde (HCHO), 42 g/L of sodium hydroxide (NaOH), 0.12 g/L of polyethylene glycol (PEG), and 83 mg/L of bipyridyl.

Additionally, in the method of manufacturing a brake pedal coil printed circuit board for vehicles according to the present invention, in S300, the electrolytic copper-plated layer may be formed to have a thickness of 20 μm by electroplating for 60 minutes with a plating solution, which includes 185 g/L of sulfuric acid (used in a semi-tower system), 83 g/L of copper sulfate, 20 mL/L of an additive, 51 mg/L of a leveling agent, and 51 mg/L of a brightener, at a temperature of 21° C. and a current density of 1.8 A/dm$^2$ to 2.0 A/dm$^2$. Here, the electrolytic copper-plated layer may be formed to have a thickness of 35 μm to 40 μm by performing two cycles of the electroplating.

Also, in the method of manufacturing a brake pedal coil printed circuit board for vehicles according to the present invention, S400 may be performed by a second imaging process. Here, the second imaging process may include a dry film lamination process (A2) of laminating a photoresist PR on the electrolytic copper-plated layer excluding a region of the through hole A and then laminating a dry film, which has a circuit pattern of a predetermined shape formed therein, on the photoresist using a roller having a roller temperature of 98° C. to 120° C. (±5° C.), a roller pressure of 0.25 to 0.55 MPa, and a roller speed of 0.75 to 0.85 m/min, an exposure process (B2) of irradiating the dry film of the circuit pattern of the predetermined shape with light which is radiated with a light intensity of 50 to 100 mJ/cm$^2$ by an 8 kW exposure system so that the circuit pattern of the predetermined shape is formed in the photoresist, a developing process (C2) of spraying 0.5% to 1.0% (vol) of a sodium carbonate developing solution having a temperature of 24° C. to 30° C. at a spray pressure of 0.10 MPa to 0.15 MPa to remove the photoresist from a region excluding the circuit pattern of the predetermined shape and the hole land, an etching process (D2) of spraying 150 g/L to 220 g/L of a copper metal etching solution at a temperature of 45° C. to 53° C. and a specific gravity (at 20° C.) of 1.19±0.03 at a pressure of 1.5 kgf/cm$^2$ (±1.0) to remove the second copper foil and the electrolytic copper-plated layer from the region excluding the circuit pattern of the predetermined shape and the hole land, and an stripping process (E2) of spraying 2% to 4.2% (vol) of a sodium hydroxide stripping solution at a temperature of 48° C. to 60° C. at a spray pressure of 0.14 MPa to 0.16 MPa to remove the photoresist remaining on the circuit pattern of the predetermined shape. In this case, the second imaging process may be performed to form predetermined outer layer circuits, and a dry film having a thickness of 50 μm may be used as the dry film during the dry film lamination process (A2).

In addition, in the method of manufacturing a brake pedal coil printed circuit board for vehicles according to the present invention, after formation of the predetermined outer layer circuits, on a conveyor moving at a speed of 1.5 m/min to 2.4 m/min, jet scrubbing and ultrasonic cleaning (1,200 Watt×3 zones/4 kHz) in which aluminum oxide (Al$_2$O$_3$ (#420)) is sprayed to the predetermined outer layer circuits and the hole land of the through hole A at a pressure of 1.3 kg/cm$^2$ to 2.2 kg/cm$^2$ to remove foreign substances from surfaces of the predetermined outer layer circuits and the hole land and to form roughness may be performed.

Additionally, in the method of manufacturing a brake pedal coil printed circuit board for vehicles according to the present invention, a micro soft etching process of forming uniform roughness on surfaces of the circuits and the hole land may be performed after the jet scrubbing and ultrasonic cleaning in order to improve close adhesion when a solder resist is applied. Here, the micro soft etching process may be performed on a conveyor moving at a speed of 1.2 m/min to 2.4 m/min under a condition of an etching rate of 2.2 μm to 3.4 μm by etching at a temperature of 32° C. (±5° C.) using a micro soft etching solution which includes 85 mL/L of 95% sulfuric acid (H$_2$SO$_4$), 65 mL/L of 35% hydrogen peroxide (H$_2$O$_2$), a predetermined amount of deionized (DI) water, and 33 mL/L of an etching solution and has a specific gravity of 1.030 to 1.040 and a pH of 3.00 or less.

Also, in the method of manufacturing a brake pedal coil printed circuit board for vehicles according to the present invention, the process conditions used to apply the PSR ink may include drying in which a PSR ink having an ink viscosity of 150±10 poises and a specific gravity of 1.48 to 1.52, which is prepared by mixing a main ingredient having a viscosity of 270±10 poises with a curing agent having a viscosity of 30±10 poises, is primarily pre-cured at 75° C. for 18 to 22 minutes and secondarily pre-cured at 75° C. for 18 to 22 minutes using a printed silk screen having a mesh size of 100 to 120, and then post-cured at 150° C. for 65 to 80 minutes, exposure to irradiation with light at a light intensity of 450 to 550 mJ/cm$^2$, and development by spraying 1% by weight of a sodium carbonate developing solution having a temperature of 32° C.±1° C. at a spray pressure of 2.2 to 2.8 kgf/cm$^2$ for 100 to 140 seconds.

In addition, in the method of manufacturing a brake pedal coil printed circuit board for vehicles according to the present invention, after the solder resist is applied, the jet scrubbing and ultrasonic cleaning process may be further performed on a surface of the applied solder resist. Here, the jet scrubbing and ultrasonic cleaning process may be performed on a conveyor moving at a speed of 2.2 m/min to 2.7 m/min by performing jet scrubbing in which an acid rinse including 55 mL/L of H$_2$SO$_4$ (95%) and DI water and aluminum oxide (Al$_2$O$_3$ (#420)) are sprayed onto the surface formed by the marking process at a pressure of 1.7 kg/cm2 to 2.5 kg/cm$^2$, cleaning the surface with DI water (rinsing six times) at 1,200 Watt×3 zones/4 kHz, performing ultrasonic cleaning, and then drying the surface at 75° C. to 95° C. in order to remove foreign substances from the surface formed by the marking process and form roughness.

Further, in the method of manufacturing a brake pedal coil printed circuit board for vehicles according to the present invention, the Ni-plated layer and the Au-plated layer may be formed by electroplating at temperature of 53° C. and a current density of 0.3 to 0.4 A/dm$^2$ for 15 to 20 minutes with a Ni plating solution which includes 44 g/L of nickel chloride, 110 g/L of aminotrimethylene phosphonic acid, 110 g/L of nickel sulfate, 54 g/L of ascorbic acid, 54 g/L of boric acid, and 0.12 g/L of a brightener to form a Ni-plated layer having a thickness of 4 μm to 5 μm and electroplating at a temperature of 55° C., a pH of 4.5 and a current density of 12 A/dm$^2$ for 15 to 20 minutes with a soft gold plating solution which includes 17 g/L of potassium gold cyanide, 120 g/L of tripotassium citrate monohydrate, 65 g/L of a citric anhydride, 0.6 g/L of hexamethylene tetramine, and 0.6 g/L of 3-pyridine carboxylic acid to form an Au-plated layer having a thickness of 0.04 μm to 0.05 μm.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION

Figure 1:
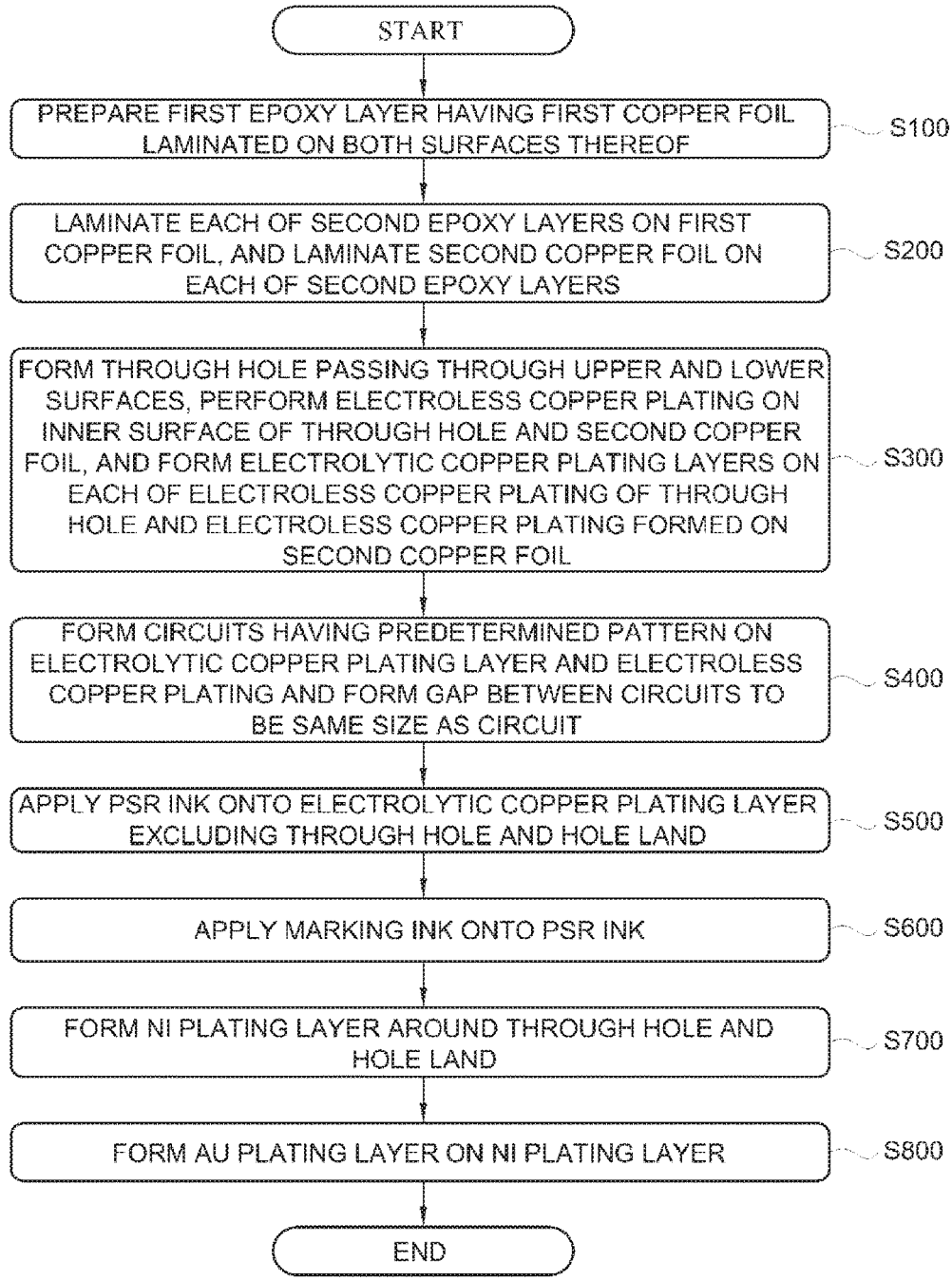
FIG. 1 is a flowchart illustrating the order of steps of a method of manufacturing a brake pedal coil printed circuit board for vehicles according to one exemplary embodiment of the present invention.

Various changes and modifications can be made to the present invention, which can include various exemplary embodiments. Therefore, certain embodiments of the present invention will be shown in the drawings and described in the detailed description. However, it should be understood that the certain embodiments proposed herein are not intended to limit the scope of the invention and cover all such changes and modifications within the scope of the appended claims and their equivalents. In describing the present invention, detailed descriptions of the prior art related to the present invention will be omitted for clarity when the detailed descriptions are considered to obscure the gist of the present invention.

Also, it should be understood that, although the terms first, second, etc. may be used herein to describe various elements, these elements should not be limited by these terms. These terms are used only to distinguish one element from another.

In addition, it will be understood that when an element is referred to as being "connected" or "coupled" to another element throughout the specification, it can be directly connected or coupled to the other element or intervening elements may be present. In contrast, when an element is referred to as being "directly connected" or "directly coupled" to another element, there are no intervening elements present. Also, it will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Additionally, the terms "part," "module" and the like disclosed herein refer to units configured to fulfill at least one function or operation which may be implemented as hardware, software, or a combination thereof.

Further, in describing the present invention, detailed descriptions of the prior art related to the present invention will be omitted for clarity when the detailed descriptions are considered to obscure the gist of the present invention.

Hereinafter, embodiments of the present invention will be described in detail with reference to the accompanying drawings.

FIG. 1 is a flowchart illustrating the order of steps of a method of manufacturing a brake pedal coil printed circuit board for vehicles according to one exemplary embodiment of the present invention.

Referring to FIG. 1, the method of manufacturing a brake pedal coil printed circuit board for vehicles according to one exemplary embodiment of the present invention includes preparing a first epoxy layer 100 having first copper foil 110 laminated on both surfaces thereof (S100), laminating each of second epoxy layers 200a and 200b on the first copper foil 110, and laminating a second copper foil 210 on each of the second epoxy layers 200a and 200b, (S200), forming a through hole A passing through upper and lower surfaces, performing electroless copper plating on an inside surface of the through hole A and the second copper foil 210, and forming an electrolytic copper-plated layer 220 on each of the electroless copper-plated layer 215 of the through hole A and the electroless copper-plated layer 215 formed on the second copper foil 210 (S300), forming circuits having a predetermined pattern on the electrolytic copper-plated layer 220 and the electroless copper-plated layer 215 and forming a gap between the circuits to have the same size as the circuits (S400), applying a PSR ink 250 onto the electrolytic copper-plated layer 220 excluding the through hole A and a hole land (S500), applying a marking ink 260 onto the PSR ink 250 (S600), forming a nickel (Ni)-plated layer 230 around the through hole A and the hole land (S700), and forming a gold (Au)-plated layer 240 on the Ni-plated layer 230 (S800).

The above are described in further detail with reference to the accompanying drawings.

Figure 2:
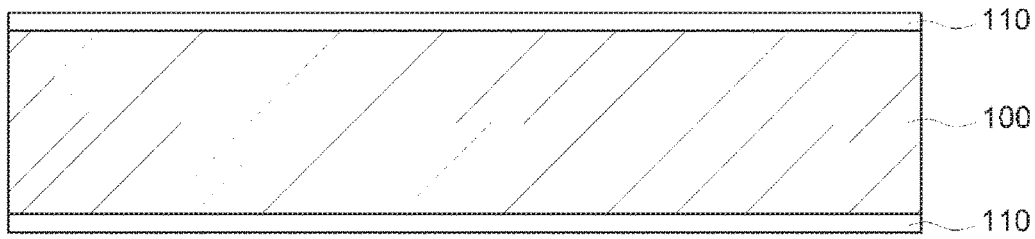
FIG. 2 is a cross-sectional view showing the first step of the method of manufacturing a brake pedal coil printed circuit board for vehicles according to one exemplary embodiment of the present invention.

FIG. 2 is a cross-sectional view showing the first step of the method of manufacturing a brake pedal coil printed circuit board for vehicles according to one exemplary embodiment of the present invention.

Referring to FIG. 2, a first epoxy layer 100 having first copper foil 110 laminated on both surfaces thereof is prepared. Here, the first epoxy layer 100 is a 300 μm-thick prepreg that has a coefficient of thermal expansion (CTE) of 45 ppm/° C., a glass transition temperature (TG) of 150° C. and a thermal decomposition temperature (TD) of 370° C. and includes 1-ounce (oz) first copper foil formed on both surfaces thereof.

Figure 3:
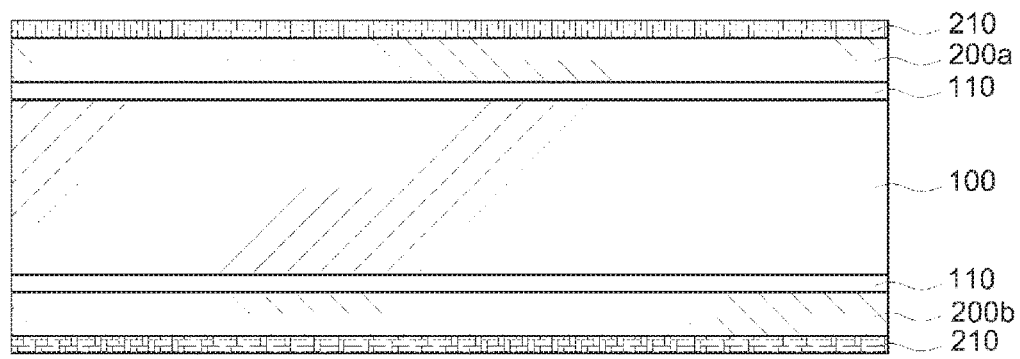
FIG. 3 is a cross-sectional view showing the second step of the method of manufacturing a brake pedal coil printed circuit board for vehicles according to one exemplary embodiment of the present invention.

Next, FIG. 3 is a cross-sectional view showing the second step of the method of manufacturing a brake pedal coil printed circuit board for vehicles according to one exemplary embodiment of the present invention.

Referring to FIG. 3, each of second epoxy layers 200a and 200b are laminated on the first copper foil 110, and second copper foil 210 is laminated on each of the second epoxy layers 200a and 200b.

A first imaging process is performed on the first epoxy layer 100 and the first copper foil 110 before the second epoxy layers 200a and 200b are laminated on the first copper foil 110 and the second copper foil 210 is laminated on the second epoxy layers 200a and 200b as described above.

Such a first imaging process includes a dry film lamination process (A1) of laminating a photoresist PR on the first copper foil 110 and then laminating a dry film, which has a circuit pattern of a predetermined shape formed therein, on the photoresist using a roller having a roller temperature of 95° C. to 120° C., a roller pressure of 0.2 to 0.5 MPa, and a roller speed of 0.75 to 0.85 m/min, an exposure process (B1) of irradiating the dry film of the circuit pattern of the predetermined shape with light which is radiated with a light intensity of 20 to 50 mJ/cm$^2$ by an 8 kW exposure system so that the circuit pattern of the predetermined shape is formed in the photoresist, a developing process (C1) of spraying 0.5% to 1.0% (vol) of a sodium carbonate developing solution having a temperature of 24° C. to 30° C. at a spray pressure of 0.10 MPa to 0.15 MPa to remove the photoresist from a region excluding the circuit pattern of the predetermined shape and the hole land, an etching process (D1) of spraying 150 g/L to 220 g/L of a copper metal etching solution at a temperature of 45° C. to 53° C. and a specific gravity (at 20° C.) of 1.19±0.03 at a pressure of 1.5 kgf/cm$^2$ (±1.0) to remove the first copper foil 110 from the region excluding the circuit pattern of the predetermined shape and the hole land, and a stripping process (E1) of spraying 2% to 4.2% (vol) of a sodium hydroxide stripping solution at a temperature of 48° C. to 60° C. at a spray pressure of 0.10 MPa to 0.14 MPa to remove the photoresist remaining on the circuit pattern of the predetermined shape. In this case, the steps of the first imaging process are performed to form a predetermined inner layer circuit, and a dry film having a thickness of 20 μm is used as the dry film during the dry film lamination process (A1).

Here, the dry film lamination process (A1) is performed using a roller having a roller temperature of 95° C. to 120° C., a roller pressure of 0.2 to 0.5 MPa and a roller speed of 0.75 to 0.85 m/min, the exposure process (B1) is performed by irradiation with light at a light intensity of 20 to 50 mJ/cm2 using an 8 kW exposure system, the developing process (C1) is performed by spraying 0.5% to 1.0% (vol) of a sodium carbonate developing solution having a temperature of 24° C. to 30° C. at a spray pressure of 0.10 MPa to 0.15 MPa, the etching process (D1) is performed by spraying 150 g/L to 220 g/L of a copper metal etching solution at a temperature of 45° C. to 53° C. and a specific gravity (at 20° C.) of 1.19±0.03 at a pressure of 1.5 kgf/cm$^2$ (±1.0), and the stripping process (E1) is performed by spraying 2% to 4.2% (vol) of a sodium hydroxide stripping solution at a temperature of 48° C. to 60° C. at a spray pressure of 0.10 MPa to 0.14 MPa.

In particular, a dry film having a thickness of 20 μm may be used as the dry film during the dry film lamination process (A1).

In the inner layer imaging process for forming the inner layer circuit as described above, a dry film having a thickness of 20 μm is used as the dry film. In this way, the dry film having a thickness of 20 μm is used to enhance resolution since a correlation between a gap between the circuits and a width of the circuits is important. That is, the width of the circuits and the gap between the circuits may be realized to be 50 μm when the dry film having a thickness of 20 μm is used. When a conventional dry film having a thickness of 40 μm is used, the width of the circuits and the gap between the circuits may not be realized to be 50 μm, and, when the dry film having a thickness of 40 μm is used, the width of the circuits and the gap between the circuits may be realized to be approximately 70 μm.

As such, automated optical inspection (AOI; a reliability test) is performed after the first imaging process.

Next, an oxide process of oxidizing a copper surface of the predetermined inner layer circuit is further performed after the first imaging process. Such an oxide process is performed as a brown oxide process performed according to the structural formula for an oxide reaction: $2Cu+ClO_2 \rightarrow Cu_2O$ (cupric oxide)+ClO.

More specifically, after formation of the inner layer circuit, a Cu surface is oxidized to form an oxide layer made of $Cu_2O$ or CuO, and a brown oxide process is performed to enhance close adhesion of copper foil (Cu foil) of an inner layer to glass fiber or epoxy resins.

Black oxide is obtained according to the structural formula: $Cu_2O+ClO_2 \rightarrow 2CuO$ (cuprous oxide)+ClO. In this case, since the black oxide has a peel strength value (320° C./kg/cm) of 0.50 to 0.70 kg/cm and brown oxide has a peel strength value of 0.75 to 0.90 kg/cm, the brown oxide process has been adopted due to the superior peel strength over that of the black oxide.

Figure 4:
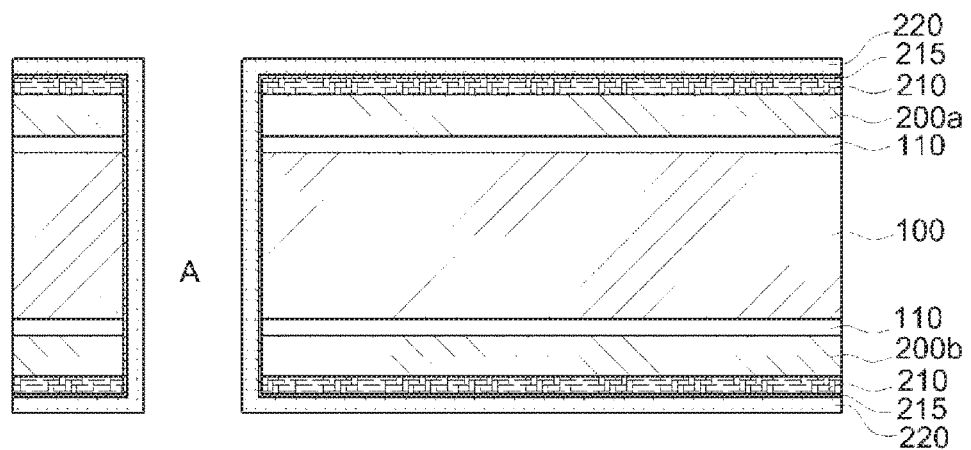
FIG. 4 is a cross-sectional view showing the third step of the method of manufacturing a brake pedal coil printed circuit board for vehicles according to one exemplary embodiment of the present invention.

Then, FIG. 4 is a cross-sectional view showing the third step of the method of manufacturing a brake pedal coil printed circuit board for vehicles according to one exemplary embodiment of the present invention.

Referring to FIG. 4, a through hole A passing through upper and lower surfaces is formed, electroless copper plating is performed on an inner surface of the through hole A and the second copper foil 210, and an electrolytic copper-plated layer 220 is formed on each of the electroless copper-plated layer 215 of the through hole A and the electroless copper-plated layer 215 formed on the second copper foil 210.

More specifically, an inner layer (2.4 m/m, 1 oz) as the first epoxy layer 100, outer layers as the second epoxy layers 200a and 200b, the first copper foil 110 and the like are stacked together to laminate a multi-layered printed circuit board having a thickness of 3.2 m/m. Next, a drilling process of processing the through hole A at a predetermined position is performed for realizing a conductor of the inner layer and the outer layers.

Computerized numeric control (CNC) M/C drilling is performed to form such a through hole A.

After the drilling process, a de-smear process of removing remnants or attachments of the second epoxy layers 200*a* and 200*b* with KMnO$_4$ is performed. In this case, the remnants or attachments are produced by heat of friction caused while drilling interfaces between the first copper foil 110 and the second epoxy layers 200*a* and 200*b*.

Subsequently, chemical copper plating is performed.

After the de-smear process, a process of performing chemical plating on an inside portion of the through hole A is performed as a method of converting the inside portion of the through hole A from a non-conductive hole to a conductive hole.

First of all, the electroless copper-plated layer 215 is formed to have a thickness of 1.3 μm to 1.7 μm by performing the electroless copper plating at a temperature of 40° C. (±2° C.) for 28 minutes in a plating solution which includes 82 g/L of copper sulfate, 155 g/L of ethylenediamine tetraacetic acid (EDTA), 32 mL/L of formaldehyde (HCHO), 42 g/L of sodium hydroxide (NaOH), 0.12 g/L of polyethylene glycol (PEG), and 83 mg/L of bipyridyl.

Next, the electrolytic copper-plated layer 220 is formed to have a thickness of 20 μm by electroplating for 60 minutes with a plating solution which includes 185 g/L of sulfuric acid (used in a semi-tower system), 83 g/L of copper sulfate, 20 mL/L of an additive, 51 mg/L of a leveling agent, and 51 mg/L of a brightener, at a temperature of 21° C. and a current density of 1.8 A/dm$^2$ to 2.0 A/dm2. In this case, the electrolytic copper-plated layer 220 is formed to have a thickness of 35 μm to 40 μm by performing two cycles of the electroplating.

Figure 5:
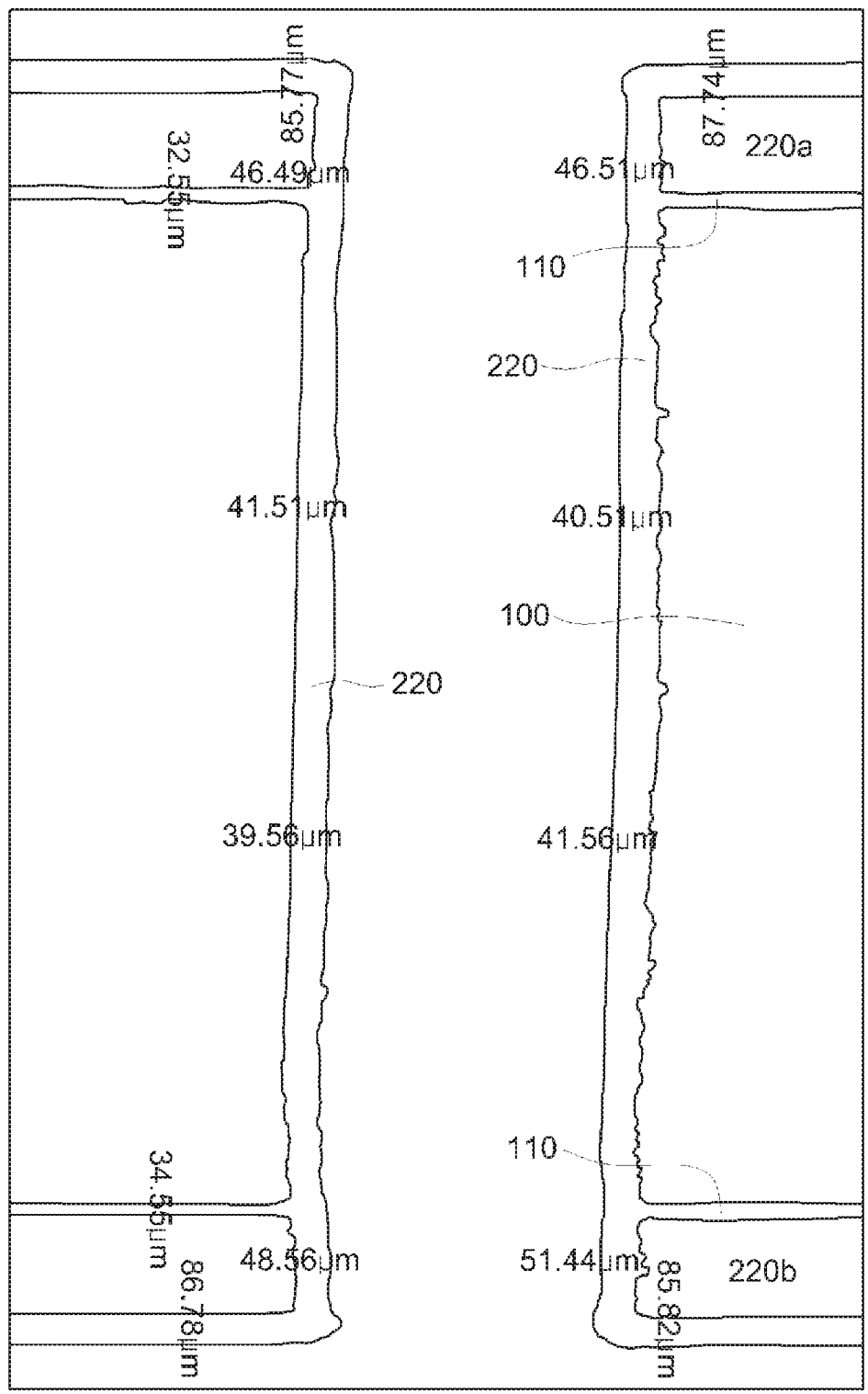
FIG. 5 is a view showing a thickness distribution of a plating inside of a through hole after copper electroplating in a brake pedal coil printed circuit board for vehicles according to another exemplary embodiment of the present invention.

The results can be seen from FIG. 5.

That is, FIG. 5 is a view showing a thickness distribution of plating inside of the through hole after copper electroplating in a brake pedal coil printed circuit board for vehicles according to another exemplary embodiment of the present invention Referring to FIG. 5, a plating thickness of an inside portion of the hole may be guaranteed to be a plating thickness of 35 μm or more by adopting two cycles of the electroplating process as described above, and the thicknesses of the outer layers and the outer layer circuits may be maintained at a plating thickness of 70 μm to 90 μm. Therefore, the brake pedal coil printed circuit board for vehicles has an effect of preventing open and separation phenomena caused by a transient overcurrent flow.

Figure 6:
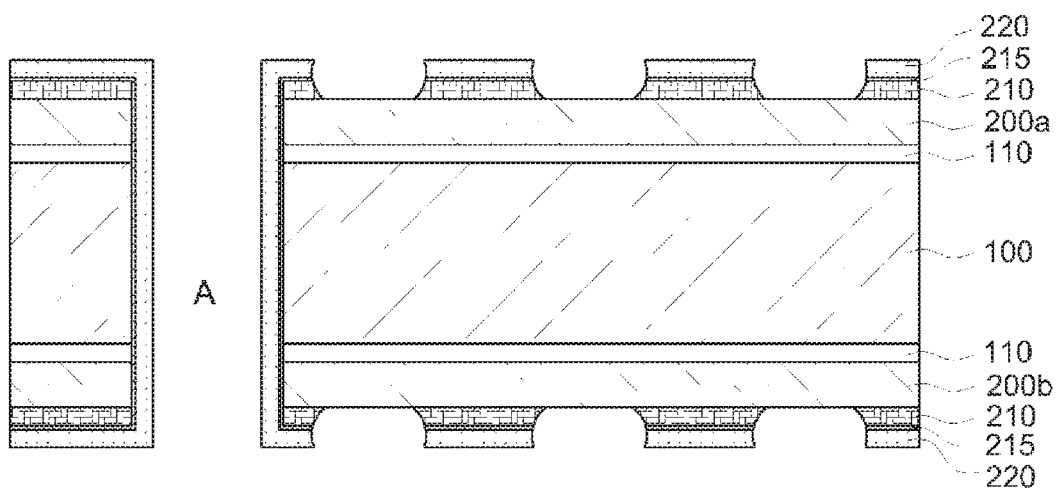
FIG. 6 is a cross-sectional view showing the fourth step of the method of manufacturing a brake pedal coil printed circuit board for vehicles according to one exemplary embodiment of the present invention.

Then, FIG. 6 is a cross-sectional view showing the fourth step of the method of manufacturing a brake pedal coil printed circuit board for vehicles according to one exemplary embodiment of the present invention.

Referring to FIG. 6, an outer layer imaging process is performed.

That is, a second imaging process is performed. Here, the second imaging process includes a dry film lamination process (A2) of laminating a photoresist PR on the electrolytic copper-plated layer 220 excluding the region of the through hole A and then laminating a dry film, which has a circuit pattern of a predetermined shape formed therein, on the photoresist using a roller having a roller temperature of 98° C. to 120° C. (±5° C.), a roller pressure of 0.25 to 0.55 MPa, and a roller speed of 0.75 to 0.85 m/min, an exposure process (B2) of irradiating the dry film of the circuit pattern of the predetermined shape with light which is radiated with a light intensity of 50 to 100 mJ/cm$^2$ by an 8 kW exposure system so that the circuit pattern of the predetermined shape is formed in the photoresist, a developing process (C2) of spraying 0.5% to 1.0% (vol) of a sodium carbonate developing solution having a temperature of 24° C. to 30° C. at a spray pressure of 0.10 MPa to 0.15 MPa to remove the photoresist from a region excluding the circuit pattern of the predetermined shape and the hole land, an etching process (D2) of spraying 150 g/L to 220 g/L of a copper metal etching solution at a temperature of 45° C. to 53° C. and a specific gravity (at 20° C.) of 1.19±0.03 at a pressure of 1.5 kgf/cm$^2$ (±1.0) to remove the second copper foil 210 and the electrolytic copper-plated layer 220 from the region excluding the circuit pattern of the predetermined shape and the hole land, and a stripping process (E2) of spraying 2% to 4.2% (vol) of a sodium hydroxide stripping solution at a temperature of 48° C. to 60° C. at a spray pressure of 0.14 MPa to 0.16 MPa to remove the photoresist remaining on the circuit pattern of the predetermined shape. In this case, the steps of the second imaging process are performed to form predetermined outer layer circuits, and a dry film having a thickness of 50 μm is used as the dry film during the dry film lamination process (A2).

Here, the dry film lamination process (A2) is performed using a roller having a roller temperature of 98° C. to 120° C. (±5° C.), a roller pressure of 0.25 to 0.55 MPa and a roller speed of 0.75 to 0.85 m/min.

Also, the exposure process (B2) is performed by irradiation with light at a light intensity of 50 to 100 mJ/cm$^2$ using an 8 kW exposure system, and the developing process (C2) is performed by spraying 0.5% to 1.0% (vol) of a sodium carbonate developing solution having a temperature of 24° C. to 30° C. at a spray pressure of 0.10 MPa to 0.15 MPa.

Meanwhile, the etching process (D2) is performed by spraying 150 g/L to 220 g/L of a copper metal etching solution at a temperature of 45° C. to 53° C. and a specific gravity (at 20° C.) of 1.19±0.03 at a pressure of 1.5 kgf/cm$^2$ (±1.0), and the stripping process (E2) is performed by spraying 2% to 4.2% (vol) of a sodium hydroxide stripping solution at a temperature of 48° C. to 60° C. at a spray pressure of 0.14 MPa to 0.16 MPa.

Here, a dry film having a thickness of 50 μm is used as the dry film during the dry film lamination process (A2).

One characteristic of the method of manufacturing a brake pedal coil printed circuit board for vehicles according to one exemplary embodiment of the present invention is maintaining a constant width for and gap between the outer layer circuits.

Therefore, a dry film having a thickness of 50 μm is selected. A reason for selecting 50 μm is that the plating thickness inside of the via hole should be maintained at 35 μm. That is, when etching solution penetrates into the hole due to damage of the dry film, a plated region may be etched to open the inside of the hole. Thus, the dry film having a thickness of 50 μm is selected in consideration of stability.

After the outer layer imaging process is performed as described above, AOI (a reliability test) is performed.

Next, after the predetermined outer layer circuits are formed, on a conveyor moving at a speed of 1.5 m/min to 2.4 m/min, jet scrubbing and ultrasonic cleaning in which aluminum oxide (Al$_2$O$_3$ (#420)) is sprayed to the predetermined outer layer circuits and the hole land of the through hole A at a pressure of 1.3 kg/cm$^2$ to 2.2 kg/cm$^2$ to remove foreign substances from surfaces of the predetermined outer layer circuits and the hole land and form roughness are performed.

That is, after formation of the outer layer circuits, regions of the circuits and the hole land are etched with Al$_2$O$_3$. Then, copper remnants existing on edge regions or surfaces of the circuits and the hole land are removed, and surface roughness is artificially created on the circuits and the hole land, thereby improving close adhesion of ink upon printing.

Also, an ultrasonic cleaning is performed in parallel to remove remnants which may exist between the circuits and remain around the hole land. This is done to remove a risk of noise generation caused by a micro-current flow through copper components between the circuits or between the hole land and the circuits. In this case, remaining $Al_2O_3$ is also removed.

After such jet scrubbing and ultrasonic cleaning, a micro soft etching process of forming uniform roughness on surfaces of the circuits and the hole land is performed in order to improve close adhesion when a solder resist is applied. In this case, the micro soft etching process is performed on a conveyor moving at a speed of 1.2 m/min to 2.4 m/min under a condition of an etching rate of 2.2 µm to 3.4 µm by etching at a temperature of 32° C. (±5° C.) using a micro soft etching solution which includes 85 mL/L of 95% sulfuric acid ($H_2SO_4$), 65 mL/L of 35% hydrogen peroxide ($H_2O_2$), a predetermined amount of DI water, and 33 mL/L of an etching solution and has a specific gravity of 1.030 to 1.040 and a pH of 3.00 or less.

After the etching process performed as the process of forming the circuits in the micro soft etching process, micro soft etching is performed on surface areas of the hole and hole land using a chemical agent in order to remove Cu remnants and foreign substances between the circuits remaining on the PCB after the jet scrubbing and ultrasonic process. This is done to form fine roughness, remove a risk of noise generation caused by the remnants such as copper and improve close adhesion of ink upon printing.

Such a process of forming the outer layer circuit is performed to form the circuits of the predetermined pattern on the electrolytic copper-plated layer 220 and the electroless copper-plated layer 215 and form a gap between the circuits that has the same size as the circuits.

Figure 7:
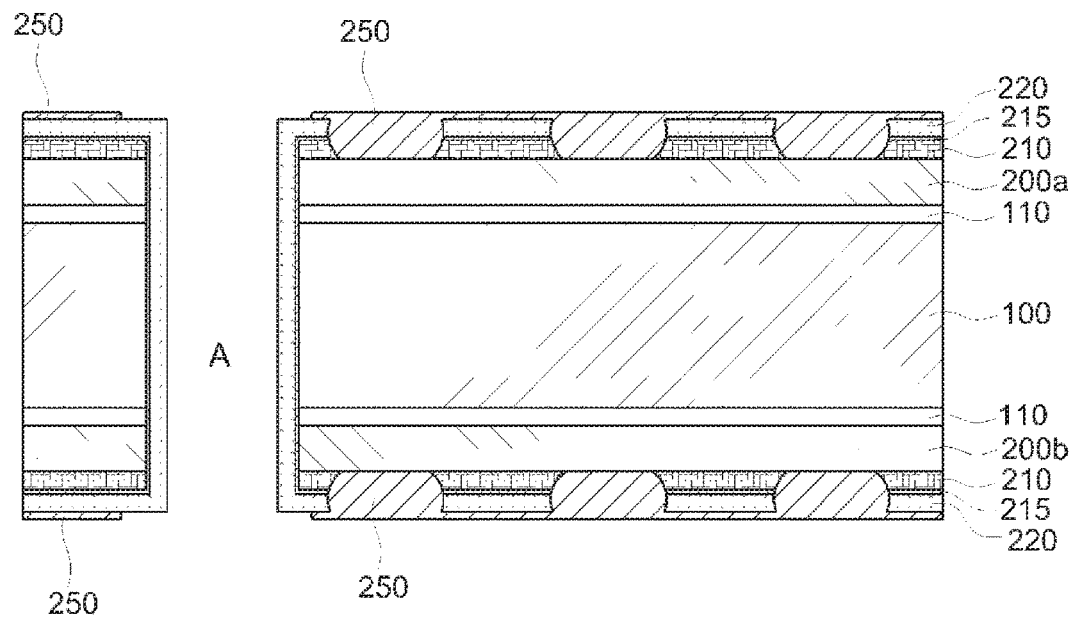
FIG. 7 is a cross-sectional view showing the fifth step of the method of manufacturing a brake pedal coil printed circuit board for vehicles according to one exemplary embodiment of the present invention.

Then, FIG. 7 is a cross-sectional view showing the fifth step of the method of manufacturing a brake pedal coil printed circuit board for vehicles according to one exemplary embodiment of the present invention.

Referring to FIG. 7, a PSR ink 250 is applied onto the electrolytic copper-plated layer 220 excluding the through hole A and the hole land.

Here, the process conditions used to apply the PSR ink 250 includes drying in which the PSR ink 250 having an ink viscosity of 150±10 poises and a specific gravity of 1.48 to 1.52, which is prepared by mixing a main ingredient having a viscosity of 270±10 poises with a curing agent having a viscosity of 30±10 poises, is primarily pre-cured at 75° C. for 18 to 22 minutes and secondarily pre-cured at 75° C. for 18 to 22 minutes using a printed silk screen having a mesh size of 100 to 120, and then post-cured at 150° C. for 65 to 80 minutes, exposure to irradiation with light at a light intensity of 450 to 550 mJ/cm², and development by spraying 1% by weight of a sodium carbonate developing solution having a temperature of 32° C.±1° C. at a spray pressure of 2.2 to 2.8 kgf/cm² for 100 to 140 seconds.

More specifically, after the etching process, the jet scrubbing and ultrasonic process and the micro soft etching process, a non-conductive solder resist ink (PSR ink) may be applied onto the electrolytic copper-plated layer 220 excluding the through hole A and the hole land to remove noise between the circuits and the hole land and between the circuits and prevent short circuits caused during a process of soldering parts to be attached to a printed circuit board. In the present invention, a predetermined thickness of ink after printing is required to thoroughly maintain a wireless sensing function due to a brake pedal and a sensor, as follows.

Figure 8:
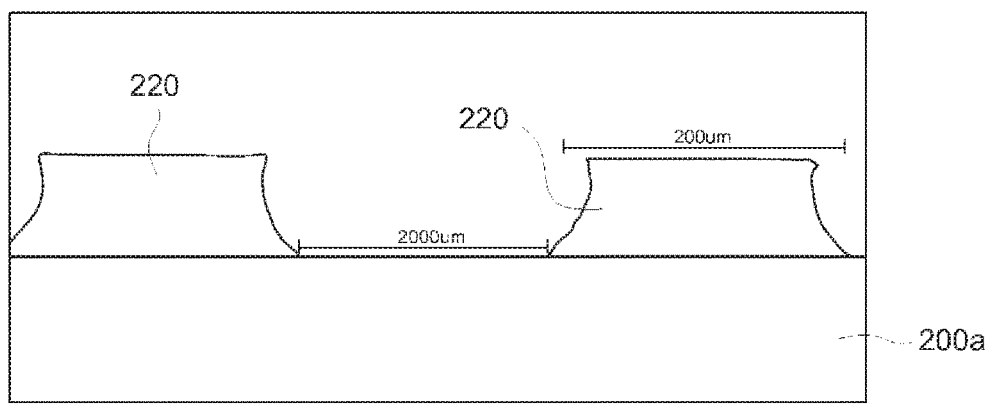
FIG. 8 is a view showing a gap between circuits and a width of a circuit in the brake pedal coil printed circuit board for vehicles according to another exemplary embodiment of the present invention.
Figure 9:
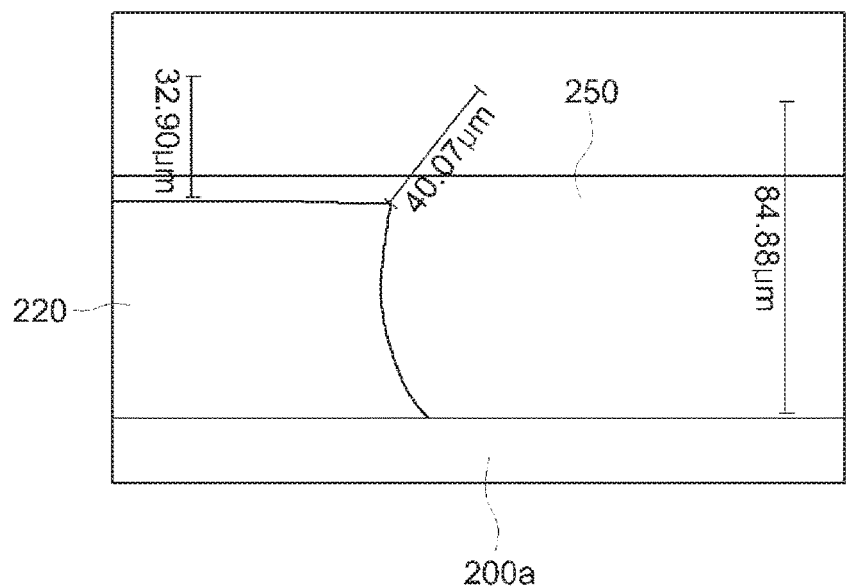
FIG. 9 is a view showing a thickness distribution of an ink on a circuit in the brake pedal coil printed circuit board for vehicles according to another exemplary embodiment of the present invention.

In this regard, FIG. 8 is a view showing a gap between circuits and a width of a circuit in the brake pedal coil printed circuit board for vehicles according to another exemplary embodiment of the present invention, and FIG. 9 is a view showing a thickness distribution of an ink on a circuit in the brake pedal coil printed circuit board for vehicles according to another exemplary embodiment of the present invention.

The following method should be performed to obtain the thickness of the ink shown in FIGS. 8 and 9.

Since the printed circuit board has a thickness of 3.2 mm, B/D having the same thickness is fixed in outside surfaces of four corners whose positions are selected to fix the B/D to be printed in the center of the printed circuit board (that is, the B/D is attached to a printer table having a width of 10 mm and a length of 415 mm). Since the viscosity, printing angle and pressure of the ink upon printing are of importance, the ink is applied onto a printing screen (a mesh size of 100 to 110) once at an angle of approximately 45° and again printed once more.

That is, when the ink is printed by the above-described method, the printing is performed with a thickness distribution in which an epoxy region on the printed circuit board has an ink thickness of 80 to 90 µm, regions of the circuits and the hole land have an ink thickness of 30 µm or more, and edge regions of the circuits and the hole land have an ink thickness of 20 µm or more.

Figure 10:
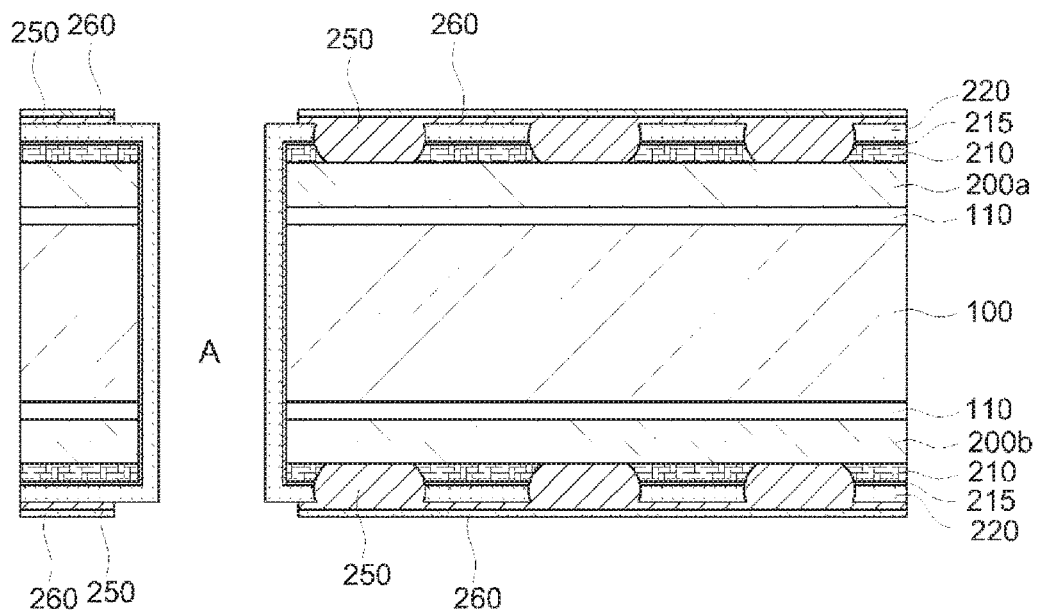
FIG. 10 is a cross-sectional view showing the sixth step of the method of manufacturing a brake pedal coil printed circuit board for vehicles according to one exemplary embodiment of the present invention.

Next, FIG. 10 is a cross-sectional view showing the sixth step of the method of manufacturing a brake pedal coil printed circuit board for vehicles according to one exemplary embodiment of the present invention.

Referring to FIG. 10, a marking ink 260 is applied onto the PSR ink 250.

Such marking printing is a process of printing symbols, character marks and the like on the printed circuit board.

Next, each process of jet scrubbing and ultrasonic cleaning is further performed on a surface of the applied solder resist. In this case, the jet scrubbing and ultrasonic cleaning process is performed on a conveyor moving at a speed of 2.2 m/min to 2.7 m/min by performing jet scrubbing in which an acid rinse including 55 mL/L of $H_2SO_4$ (95%) and DI water and aluminum oxide ($Al_2O_3$ (#420)) are sprayed onto the surface formed by the marking process at a pressure of 1.7 kg/cm2 to 2.5 kg/cm², cleaning the surface with DI water (rinsing six times) at 1,200 Watt×3 zones/4 kHz, performing ultrasonic cleaning, and then drying the surface at 75° C. to 95° C. in order to remove foreign substances from the surface formed by the marking process and form roughness.

When the ink is printed on the printed circuit board, the printing process is performed twice for 65 to 80 minutes and for 60 to 70 minutes at a high temperature of 150° C. or more. In this case, since an oxide film is formed on a copper-exposed region of the PCB and there are ink residues, etc., jet scrubbing and ultrasonic cleaning are performed for the purpose of removing the oxide film and ink residues.

Figure 11:
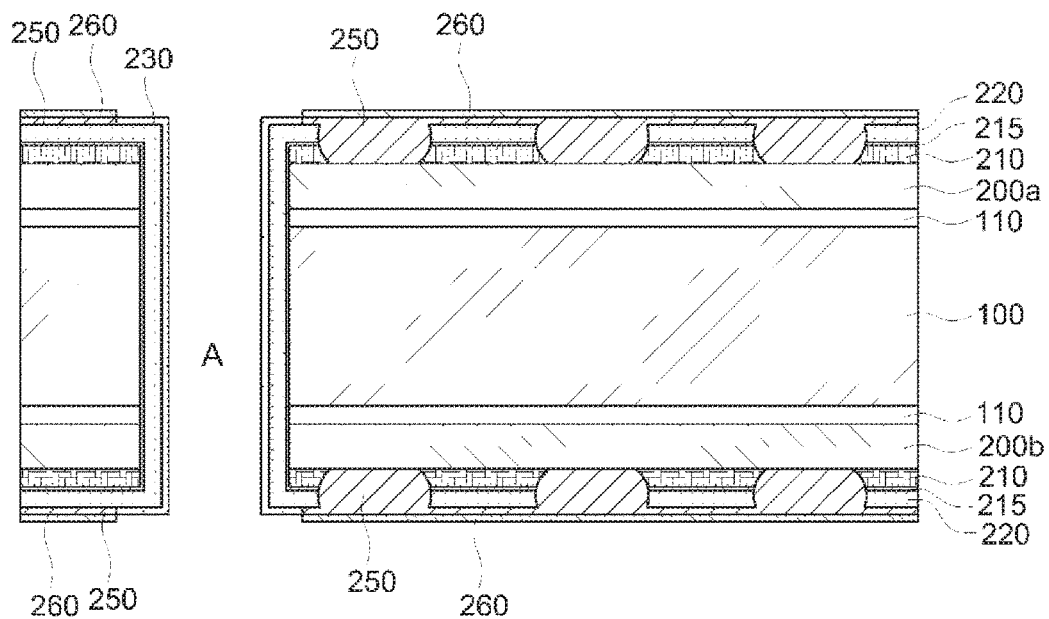
FIG. 11 is a cross-sectional view showing the seventh step of the method of manufacturing a brake pedal coil printed circuit board for vehicles according to one exemplary embodiment of the present invention.
Figure 12:
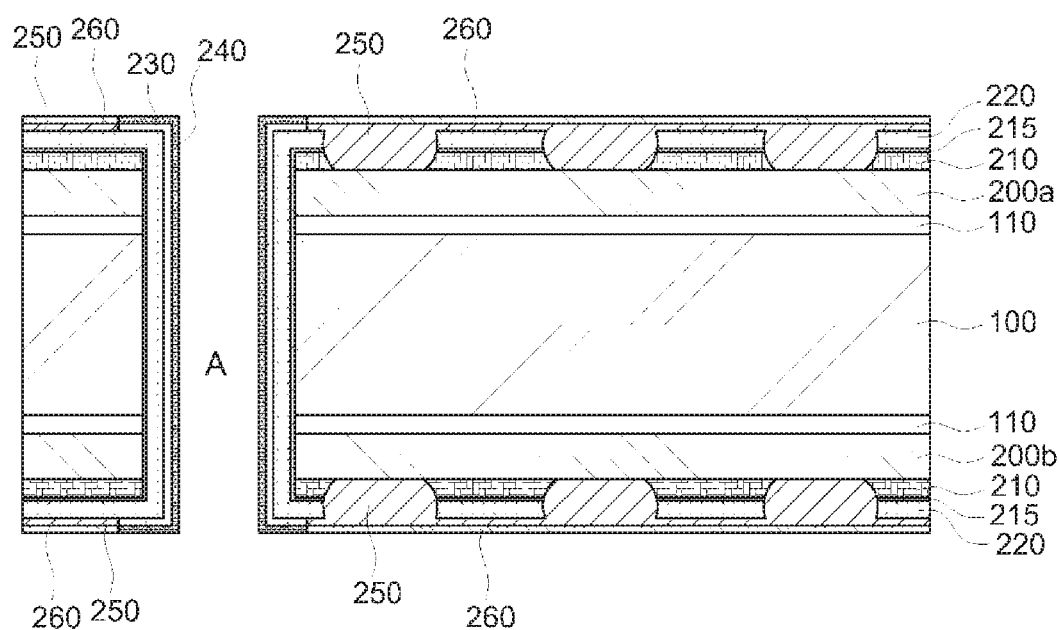
FIG. 12 is a cross-sectional view showing the eighth step of the method of manufacturing a brake pedal coil printed circuit board for vehicles according to one exemplary embodiment of the present invention.

Then, FIG. 11 is a cross-sectional view showing the seventh step of the method of manufacturing a brake pedal coil printed circuit board for vehicles according to one exemplary embodiment of the present invention, and FIG. 12 is a cross-sectional view showing the eighth step of the method of manufacturing a brake pedal coil printed circuit board for vehicles according to one exemplary embodiment of the present invention.

Referring to FIGS. 11 and 12, a Ni-plated layer 230 is formed around the through hole A and the hole land, and an Au-plated layer 240 is formed on the Ni-plated layer 230.

The Ni-plated layer 230 is formed to have a thickness of 4 μm to 5 μm by electroplating at temperature of 53° C. and a current density of 0.3 to 0.4 A/dm$^2$ for 15 to 20 minutes with a Ni plating solution which includes 44 g/L of nickel chloride, 110 g/L of aminotrimethylene phosphonic acid, 110 g/L of nickel sulfate, 54 g/L of ascorbic acid, 54 g/L of boric acid, and 0.12 g/L of a brightener.

Also, the Au-plated layer 240 is formed with a thickness of 0.04 μm to 0.05 μm by electroplating at a temperature of 55° C., a pH of 4.5 and a current density of 12 A/dm$^2$ for 15 to 20 minutes with a soft gold plating solution which includes 17 g/L of potassium gold cyanide, 120 g/L of tripotassium citrate monohydrate, 65 g/L of a citric anhydride, 0.6 g/L of hexamethylene tetramine, and 0.6 g/L of 3-pyridine carboxylic acid.

The brake pedal coil printed circuit board for vehicles according to another exemplary embodiment of the present invention should have an excellent sensing function by a sensor. In general, the printing is performed with a Ni plating thickness of 3 to 4 μm and an Au plating thickness of 0.2 to 0.3 μm. In the present invention, however, a Ni plating thickness of 4 to 5 μm or more and an Au plating thickness of 0.04 μm or more are needed. A reason for requiring a large plating thickness is to improve a sensing function by a sensor. The operational conditions used for such Ni plating and AU plating are as described above. In particular, the composition ratios of the chemicals are absolutely important for obtaining desired plating thickness distribution for each of the Ni plating and AU plating.

Subsequently, an auto bare board test process is performed.

That is, since a circuit board has a characteristically small product size and a bare board test cannot be performed when the circuit board is separated into each PCSs, the bare board test is first carried out before a CNC router process, and a reliability test is performed for items excluding open and short circuits of inner and outer layers of the printed circuit board to verify reliability of products. Operational conditions for the bare board test are as follows.

Test voltage=250 volts
Continuity resistance=50Ω
Isolation resistance=20 mΩ
Next, routing (CNC router M/C) is performed.
The exterior processing is performed according to the specifications, the maximum allowable tolerance is ±0.05 mm, and the tapping process is adopted due to the characteristics of the present invention. However, since a product has sizes of 6.8 mm and 8.6 mm (width×height) and the product can gets sucked out during the CNC router M/C due to having no guide holes formed therein, a special process is adopted, as follows. A work method is as follows.

(1) B/Ds are fixed in a CNC router table guide.
(2) Regions of both surfaces of a groove having an insert function of a product are first processed at a speed of 12 mm/sec using a router M/C set at a speed of 30,000 rpm (linear portions are not router-machined.).
(3) The B/Ds are separated from a CNC router table.
(4) A specially tailored double-sided tape with excellent close adhesion and no sticky tape adhesive is adhered to both surfaces of the B/Ds.
(5) The B/Ds are re-fixed in the CNC router table guide.
(6) The linear portions which, excluding the regions of both surfaces of the groove having an inert function, are not router-machined are first re-processed at a speed of 5 mm/sec using a router M/C set at a speed of 30,000 rpm.

(7) The B/Ds are separated from the CNC router table and then separated from each other.
(8) A CNC router requires one cycle time of approximately 365 minutes.
(9) The suitable settings for the CNC router are as follows.
RPM=120,000
Router bit=2.0 ⌀
Next, inspections of the exterior and dimensions are performed.

(1) The tape is removed from both surfaces of the B/Ds which are completely router-machined, and the B/Ds are classified according to each PCS.
(2) Appearances of printed circuit boards are visually inspected to find defects due to bad handling, etc., dimensions, etc. of would-be finished products are measured, and inspections to sort out defective products are performed and then packaged and shipped.

As described above, the characteristics of the present invention are listed as follows.

Ni plating (4 to 5 μm)
Au plating (0.04 to 0.05 μm)
PSR ink
Top portion of pattern=30 μm or more
Edge region of pattern=20 μm or more
Marking ink
marking ink 5 to 10 μm
Epoxy region of pattern=80 to 90 μm or more
Width of outer layer circuits=200 μm±10%
Gap between circuits=200 μm±10%
Cu plating thickness in hole=35 to 40 μm
Thickness of land plus circuits=70 to 90 μm According to the present invention, the method of manufacturing a brake pedal coil printed circuit board for vehicles has an effect of allowing a wireless sensor to quickly sense whether physical energy from a driver is applied to a foot brake pedal to turn on rear brake lights, etc.

It will be apparent to those skilled in the art that various modifications can be made to the above-described exemplary embodiments of the present invention without departing from the scope of the invention. Thus, it is intended that the present invention covers all such modifications provided they come within the scope of the appended claims and their equivalents.

| [Brief Description of Parts in the Drawings] | |
| --- | --- |
| 100: first epoxy layer | 110: first copper foil |
| 200a, 200b: second epoxy layer | 210: second copper foil |
| 220: electrolytic copper-plated layer | 230: Ni-plated layer |
| 240: Au-plated layer | 250: PSR ink |
| 260: marking ink | A: through hole |
| B: via hole | |

The invention claimed is:

1. A method of manufacturing a brake pedal coil printed circuit board for vehicles, comprising:
preparing a first epoxy layer having first copper foil laminated on both surfaces thereof;
laminating each of second epoxy layer m the first copper foil, and laminating second copper foil on each of the second epoxy layers;
forming a through hole passing through upper and lower surfaces of lamination of the first epoxy layer, the first copper foils, the second epoxy layers and the second copper foils, performing electroless copper plating on an inside surface of the through hole and the second copper foil, and forming an electrolytic copper-plated layer on each of the electroless copper-plated layer of the through hole and the electroless copper-plated layer formed on the second copper foil;

forming circuits having a predetermined pattern on both of the electrolytic copper-plated layer and the electroless copper-plated layer and forming a gap between the circuits to have the same size as the circuits;

applying a photo solder resist (PSR) ink onto both of the electrolytic copper-plated layer excluding the through hole and a hole land, wherein the hole land is a portion of a conductive material partially exposed near both of upper and lower peripheral ends of the through hole, the conductive material being a material electrically connecting the both of the upper and lower peripheral ends of the through hole;

applying a marking ink onto the PSR ink;

forming a nickel (Ni)-plated layer around the through hole and the hole land; and forming a gold (Au)-plated layer on the Ni-plated layer, wherein, in S300, the electroless copper-plated layer is formed to have a thickness of 1.3 µm to 1.7 µm by performing the electroless copper plating at a temperature of 40° C. (±2° C.) for 28 minutes in a plating solution which includes 82 g/L of copper sulfate, 155 g/L of ethylenediamine tetraacetic acid (EDTA), 32 mL/L of formaldehyde (HCHO), 42 g/L of sodium hydroxide (NaOH), 0.12 g/L of polyethylene glycol (PEG), and 83 mg/L of bipyridyl.

2. The method of claim 1, wherein, in S100, the first epoxy layer is a 300 µm-thick prepreg which has a coefficient of thermal expansion (CTE) of 45 ppm/° C., a glass transition temperature (TG) of 150° C. and a thermal decomposition temperature (TD) of 370° C., and includes 1-ounce (oz) first copper foil formed on both surfaces thereof.

3. The method of claim 1, further comprising a first imaging process between S100 and S200, wherein the first imaging process comprises:

a dry film lamination process (A1) of laminating a photoresist (PR) on the first copper foil and then laminating a dry film, which has a circuit pattern of a predetermined shape formed therein, on the photoresist using a roller having a roller temperature of 95° C. to 120° C., a roller pressure of 0.2 to 0.5 MPa, and a roller speed of 0.75 to 0.85 m/min;

an exposure process (B1) of irradiating the dry film of the circuit pattern of the predetermined shape with light which is radiated with a light intensity of 20 to 50 mJ/cm$^2$ by an 8 kW exposure system so that the circuit pattern of the predetermined shape is formed in the photoresist;

a developing process (C1) of spraying 0.5% to 1.0% (vol) of a sodium carbonate developing solution having a temperature of 24° C. to 30° C. at a spray pressure of 0.10 MPa to 0.15 MPa to remove the photoresist from a region excluding the circuit pattern of the predetermined shape and the hole land;

an etching process (D1) of spraying 150 g/L to 220 g/L of a copper metal etching solution at a temperature of 45° C. to 53° C. and a specific gravity (at 20° C.) of 1.19±0.03 at a pressure of 1.5 kgf/cm.sup.2 (±1.0) to remove the first copper foil from the region excluding the circuit pattern of the predetermined shape and the hole land; and a stripping process (E1) of spraying 2% to 4.2% (vol) of a sodium hydroxide stripping solution at a temperature of 48° C. to 60° C. at a spray pressure of 0.10 MPa to 0.14 MPa to remove the photoresist remaining on the circuit pattern of the predetermined shape, wherein the steps of the first imaging process are performed to form a predetermined inner layer circuit, and wherein a dry film having a thickness of 20 µm is used as the dry film during the dry film lamination process (A1).

4. The method of claim 3, after the first imaging process, further comprising an oxide process of oxidizing a copper surface of the predetermined inner layer circuit, wherein the oxide process is performed as a brown oxide process performed according to the structural formula for an oxide reaction: $2Cu+ClO_2 \rightarrow Cu_2O$ (cupric oxide)+ClO.

5. The method of claim 1, wherein, in S300, computerized numeric control (CNC) M/C drilling is performed to form the through hole, and a de-smear process of removing remnants or attachments of the second epoxy layers with $KMnO_4$ is performed wherein the remnants or attachments are produced by heat of friction caused while drilling interfaces between the first copper foil and the second epoxy layers.

6. The method of claim 1, wherein, in S300, the electrolytic copper-plated layer is formed to have a thickness of 20 µm by electroplating for 60 minutes with a plating solution, which includes 185 g/L of sulfuric acid (used in a semi-tower system), 83 g/L of copper sulfate, 20 mL/L of an additive, 51 mg/L of a leveling agent, and 51 mg/L of a brightener, at a temperature of 21° C. and a current density of 1.8 A/dm$^2$ to 2.0 A/dm$^2$, wherein the electrolytic copper-plated layer is formed to have a thickness of 35 µm to 40 µm by performing two cycles of the electroplating.

7. The method of claim 1, wherein the circuits having a predetermined pattern in S400 are manufactured by a second imaging process, wherein the second imaging process comprises:

a dry film lamination process (A2) of laminating a photoresist (PR) on the electrolytic copper-plated layer excluding a region of the through hole and then laminating a dry film, which has a circuit pattern of a predetermined shape formed therein, on the photoresist using a roller having a roller temperature of 98° C. to 120° C. (±5° C.), a roller pressure of 0.25 to 0.55 MPa, and a roller speed of 0.75 to 0.85 m/m in;

an exposure process (B2) of irradiating the dry film of the circuit pattern of the predetermined shape with light which is radiated with a light intensity of 50 to 100 mJ/cm$^2$ by an 8 kW exposure system so that the circuit pattern of the predetermined shape is formed in the photoresist;

a developing process (C2) of spraying 0.5% to 1.0% (vol) of a sodium carbonate developing solution having a temperature of 24° C. to 30° C. at a spray pressure of 0.10 MPa to 0.15 MPa to remove the photoresist from a region excluding the circuit pattern of the predetermined shape and the hole land;

an etching process (D2) of spraying 150 g/L to 220 g/L of a copper metal etching solution at a temperature of 45° C. to 53° C. and a specific gravity (at 20° C.) of 1.19±0.03 at a pressure of 1.5 kgf/cm$^2$ (±1.0) to remove the second copper foil and the electrolytic copper-plated layer from the region excluding the circuit pattern of the predetermined shape and the hole land; and a stripping process (E2) of spraying 2% to 4.2% (vol) of a sodium hydroxide stripping solution at a temperature of 48° C. to 60° C. at a spray pressure of 0.14 MPa to 0.16 MPa to remove the photoresist remaining on the circuit pattern of the predetermined shape, wherein the steps of the second imaging process are performed to form predetermined outer layer circuits, and wherein a dry film having a thickness of 50 µm is used as the dry film during the dry film lamination process (A2).

8. The method of claim 7, wherein, after formation of the predetermined outer layer circuits, on a conveyor moving at a speed of 1.5 m/min to 2.4 m/min, jet scrubbing and ultrasonic cleaning (1,200 Watt×3 zones/4 kHz) in which aluminum oxide ($Al_2O_3$ (#420)) is sprayed to the predetermined outer layer circuits and the hole land of the through hole at a pressure of 1.3 kg/cm² to 2.2 kg/cm² to remove foreign substances from surfaces of the predetermined outer layer circuits and the hole land and form roughness are performed.

9. The method of claim 8, wherein a micro soft etching process of forming uniform roughness on surfaces of the circuits and the hole land is performed after the jet scrubbing and ultrasonic cleaning in order to improve close adhesion when a solder resist is applied, wherein the micro soft etching process is performed on a conveyor moving at a speed of 1.2 m/min to 2.4 m/min under a condition of an etching rate of 2.2 µm to 3.4 µm by etching at a temperature of 32° C. (±5° C.) using a micro soft etching solution which includes 85 mL/L of 95% sulfuric acid ($H_2SO_4$), 65 mL/L of 35% hydrogen peroxide ($H_2O_2$), a predetermined amount of deionized (DI) water, and 33 mL/L of an etching solution and has a specific gravity of 1.030 to 1.040 and a pH of 3.00 or less.

10. The method of claim 1, wherein the process conditions used to apply the PSR ink comprises drying in which a PSR ink having an ink viscosity of 150±10 poises and a specific gravity of 1.48 to 1.52, which is prepared by mixing a main ingredient having a viscosity of 270±10 poises with a curing agent having a viscosity of 30±10 poises, is primarily pre-cured at 75° C. for 18 to 22 minutes and secondarily pre-cured at 75° C. for 18 to 22 minutes using a printed silk screen having a mesh size of 100 to 120, and then post-cured at 150° C. for 65 to 80 minutes, exposure to irradiation with light at a light intensity of 450 to 550 mJ/cm², and development by spraying 1% by weight of a sodium carbonate developing solution having a temperature of 32° C.±1° C. at a spray pressure of 2.2 to 2.8 kgf/cm² for 100 to 140 seconds.

11. The method of claim 10, wherein, after the solder resist is applied, the jet scrubbing and ultrasonic cleaning process is further performed on a surface of the applied solder resist, wherein the jet scrubbing and ultrasonic cleaning process is performed on a conveyor moving at a speed of 2.2 m/min to 2.7 m/min by performing jet scrubbing in which an acid rinse including 55 mL/L of $H_2SO_4$ (95%) and DI water and aluminum oxide ($Al_2O_3$ (#420)) are sprayed onto the surface formed by the marking process at a pressure of 1.7 kg/cm² to 2.5 kg/cm², cleaning the surface with DI water (rinsing six times) at 1,200 Watt×3 zones/4 kHz, performing ultrasonic cleaning, and then drying the surface at 75° C. to 95° C. in order to remove foreign substances from the surface formed by the marking process and form roughness.

12. The method of claim 1, wherein the Ni-plated layer and the Au-plated layer are formed by:

electroplating at temperature of 53° C. and a current density of 0.3 to 0.4 A/dm² for 15 to 20 minutes with a Ni plating solution, which includes 44 g/L of nickel chloride, 110 g/L of aminotrimethylene phosphonic acid, 110 g/L of nickel sulfate, 54 g/L of ascorbic acid, 54 g/L of boric acid, and 0.12 g/L of a brightener to form a Ni-plated layer having a thickness of 4 µm to 5 µm, and electroplating at a temperature of 55° C., a pH of 4.5 and a current density of 12 A/dm² for 15 to 20 minutes with a soft gold plating solution, which includes 17 g/L of potassium gold cyanide, 120 g/L of tripotassium citrate monohydrate, 65 g/L of a citric anhydride, 0.6 g/L of hexamethylene tetramine, and 0.6 g/L of 3-pyridine carboxylic acid to form an Au-plated layer having a thickness of 0.04 µm to 0.05 µm.

* * * * *